United States Patent
Chen et al.

(10) Patent No.: US 10,685,831 B2
(45) Date of Patent: Jun. 16, 2020

(54) SEMICONDUCTOR STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Fu Cheng Chen, Shanghai (CN); Jian Gang Lu, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 15/986,023

(22) Filed: May 22, 2018

(65) Prior Publication Data
US 2018/0337038 A1    Nov. 22, 2018

(30) Foreign Application Priority Data
May 22, 2017 (CN) .......................... 2017 1 0363176

(51) Int. Cl.
*H01L 21/02* (2006.01)
*H01L 21/321* (2006.01)
(Continued)

(52) U.S. Cl.
CPC .... *H01L 21/02205* (2013.01); *H01L 21/3212* (2013.01); *H01L 21/6835* (2013.01); *H01L 23/10* (2013.01); *H01L 23/13* (2013.01); *H01L 23/3114* (2013.01); *H01L 23/3731* (2013.01); *H01L 24/05* (2013.01); *H01L 23/3735* (2013.01); *H01L 2221/68327* (2013.01);
(Continued)

(58) Field of Classification Search
CPC ............... H01L 21/02205; H01L 23/13; H01L 23/3114; H01L 21/6835; H01L 23/3731
USPC .......................................................... 257/712
See application file for complete search history.

(56) References Cited

U.S. PATENT DOCUMENTS

| 8,138,597 B2* | 3/2012 | Chiang ................ H01L 23/367 257/676 |
| 2005/0035983 A1* | 2/2005 | Cruchon-Dupeyrat ..................... B82Y 10/00 346/140.1 |
| 2016/0372401 A1* | 12/2016 | Mu ........................ H01L 23/481 |

FOREIGN PATENT DOCUMENTS

| CN | 103441080 A | 12/2013 |
| CN | 103594441 A | 2/2014 |
| CN | 103681535 A | 3/2014 |

* cited by examiner

*Primary Examiner* — Bo Fan
(74) *Attorney, Agent, or Firm* — Anova Law Group, PLLC

(57) ABSTRACT

A semiconductor structure includes providing a substrate including a first surface and a second surface opposite to the first surface. The first surface is a functional surface. The method also includes forming a plastic seal layer on the first surface of the substrate, and performing a thinning-down process on the second surface of the substrate after forming the plastic seal layer. The plastic seal layer provides support for the substrate during the thinning-down process, and thus warping or cracking of the plastic seal layer 240 may be avoided. In addition, the plastic seal layer can also be used as a material for packaging the substrate. Therefore, after the thinning-down process, the plastic seal layer does not need to be removed. As such, the fabrication process is simplified, and the production cost is reduced.

17 Claims, 6 Drawing Sheets

(51) Int. Cl.
  *H01L 23/00*      (2006.01)
  *H01L 23/373*     (2006.01)
  *H01L 23/10*      (2006.01)
  *H01L 21/683*     (2006.01)
  *H01L 23/31*      (2006.01)
  *H01L 23/13*      (2006.01)

(52) U.S. Cl.
  CPC ............... *H01L 2224/02166* (2013.01); *H01L 2224/05624* (2013.01); *H01L 2224/05647* (2013.01); *H01L 2224/29101* (2013.01); *H01L 2224/32225* (2013.01); *H01L 2224/48091* (2013.01); *H01L 2224/48227* (2013.01); *H01L 2224/48472* (2013.01); *H01L 2224/73265* (2013.01); *H01L 2924/00014* (2013.01); *H01L 2924/1203* (2013.01); *H01L 2924/1304* (2013.01); *H01L 2924/13055* (2013.01); *H01L 2924/13091* (2013.01); *H01L 2924/3511* (2013.01)

SEMICONDUCTOR STRUCTURES AND FABRICATION METHODS THEREOF

CROSS-REFERENCES TO RELATED APPLICATIONS

This application claims the priority of Chinese Patent Application No. CN201710363176.7, filed on May 22, 2017, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

With the continuous improvement of the integration level of integrated circuits (ICs), packaging technology has become a hot focus in the microelectronic industry. Wafer thinning process is an integral part of advanced packaging technology, and has an important application in chip packaging.

After the wafer thinning process, the thickness of the wafer may become very small. In order to prevent the wafer from warping or cracking, according to current packaging technology, the process to thin down the wafer may include the following exemplary steps. A carrier plate is provided. The wafer and the carrier plate may then be bonded together. After bonding the wafer to the carrier plate, a thinning-down process may be performed on the portion of the wafer surface exposed by the carrier plate. After the thinning-down process, the carrier plate may be de-bonded to remove the carrier plate.

However, the conventional methods for fabricating semiconductor structures may still be complicated, and the production cost may still be high. The disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor structure. The method includes providing a substrate including a first surface and a second surface opposite to the first surface. The first surface is a functional surface. The method also includes forming a plastic seal layer on the first surface of the substrate, and performing a thinning-down process on the second surface of the substrate after forming the plastic seal layer.

Another aspect of the present disclosure provides a semiconductor structure. The semiconductor structure includes a substrate including a first surface and a second surface opposite to the first surface, and a plastic seal layer formed on the first surface of the substrate. The first surface is a functional surface. The substrate is thinned down from the second surface after the plastic seal layer is formed.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

FIGS. 1-4 illustrate schematic cross-section views of semiconductor structures at certain stages of a semiconductor fabrication method.

Figure 1:
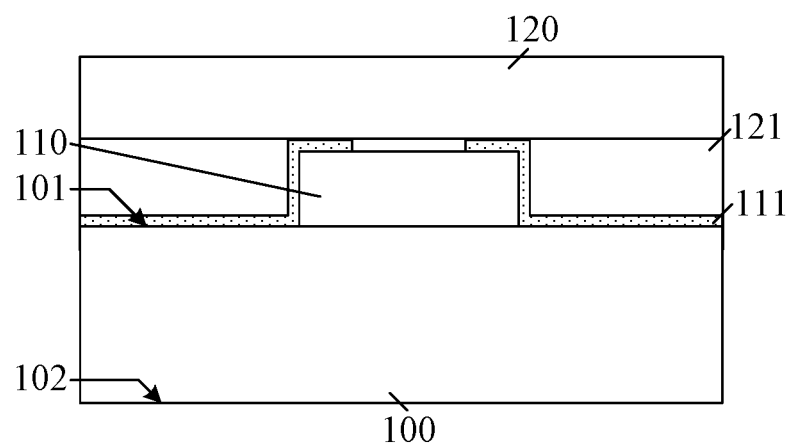
FIGS. 1-4 illustrate schematic cross-section views of semiconductor structures at certain stages of a semiconductor fabrication method.

Referring to FIG. 1, an initial base substrate is provided. The initial base substrate includes a substrate 100. The substrate 100 further includes a first surface 101, and a second surface 102 opposite to the first surface 101. The initial base substrate also includes a soldering pad 110 formed on the first surface 101 of the substrate 100, and a passivation layer 111 formed on the soldering pad 110 and the substrate 100. The passivation layer 111 exposes a portion of the soldering pad 110.

Further, a carrier wafer 120 is provided. The carrier wafer 120 is then bonded to the passivation layer 111 and the soldering pad 110 by using an adhesive glue layer 121.

Figure 2:
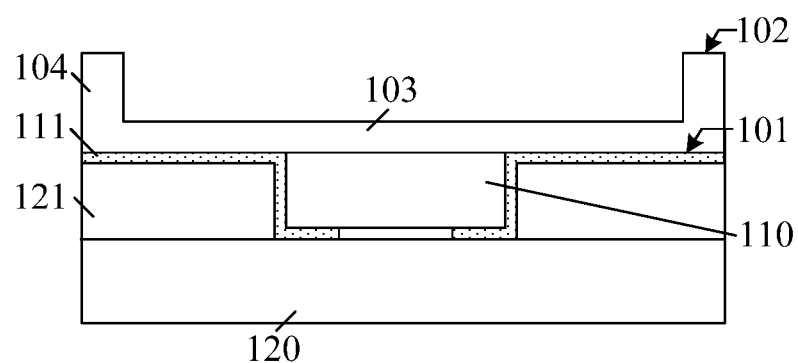

Referring to FIG. 2, after bonding the carrier wafer 120 to the passivation layer 111 and the soldering pad 110, a thinning-down process is performed on the second surface 102 of the substrate 100 to form a main substrate 103 and a support substrate 104 surrounding the main substrate 103.

Figure 3:
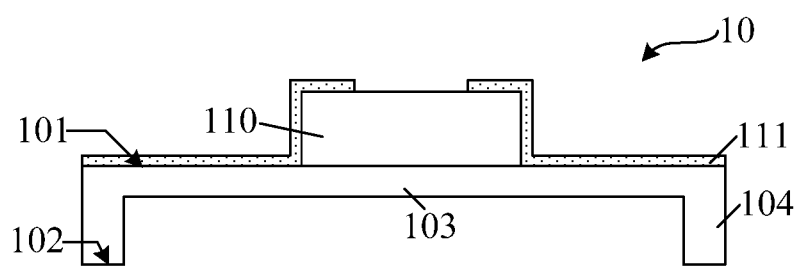

Referring to FIG. 3, after the thinning-down process, the carrier wafer 120 is removed so that the initial base substrate may become a base substrate 10.

Figure 4:
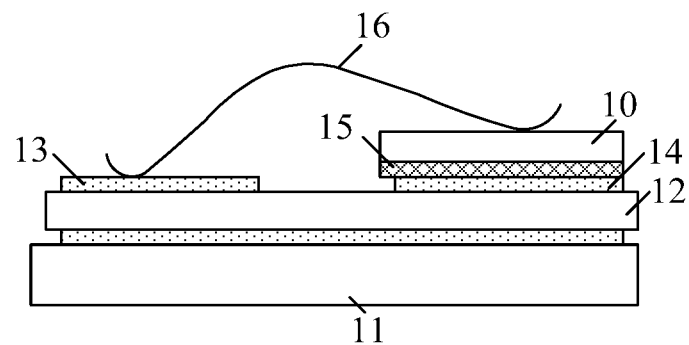

Further, referring to FIG. 4, a base board 11 is provided. A heat dissipation plate 12 is formed on the base board 11. A first conduction layer 13 and, separated from the first conduction layer 13, a second conduction layer 14 are formed on the heat dissipation plate 12. The second surface 102 of the base substrate 10 is connected to the second conduction layer 14 through a soldering layer 15. Further, the soldering pad 110 of the base substrate 10 is connected to the first conduction layer 13 using a conduction wire 16.

During the thinning-down process, the thickness of the main substrate 103 gradually decreases. In order to prevent the main substrate 103 from warping or cracking during the thinning-down process, the initial base substrate needs to be bonded to the carrier wafer 120. Accordingly, after the thinning-down process, the carrier wafer 120 needs to be removed through a de-bonding process. Therefore, the method may include a relatively complicated fabrication process.

Figure 13:
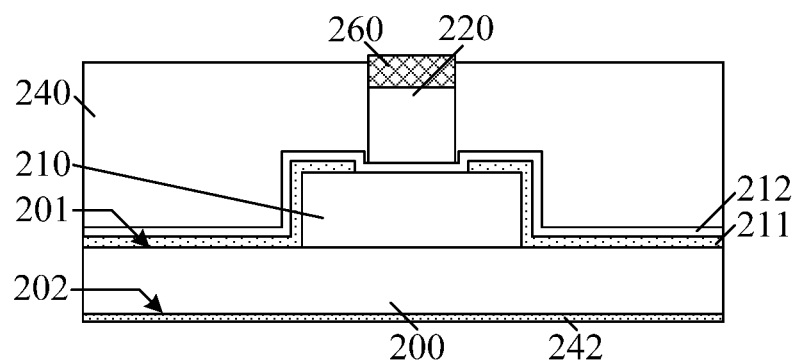
Figure 14:
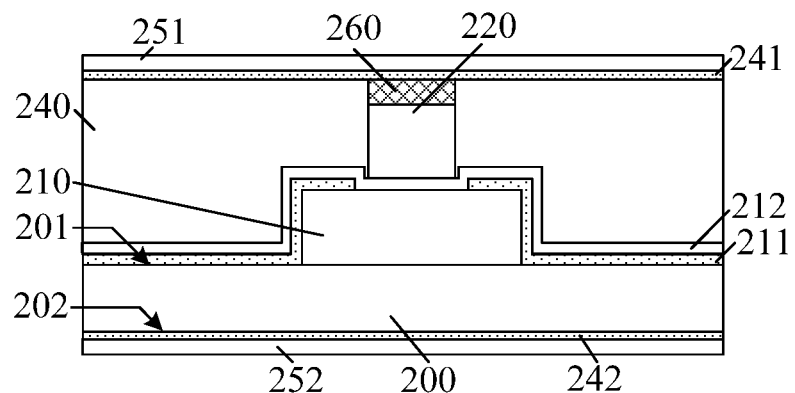
Figure 15:
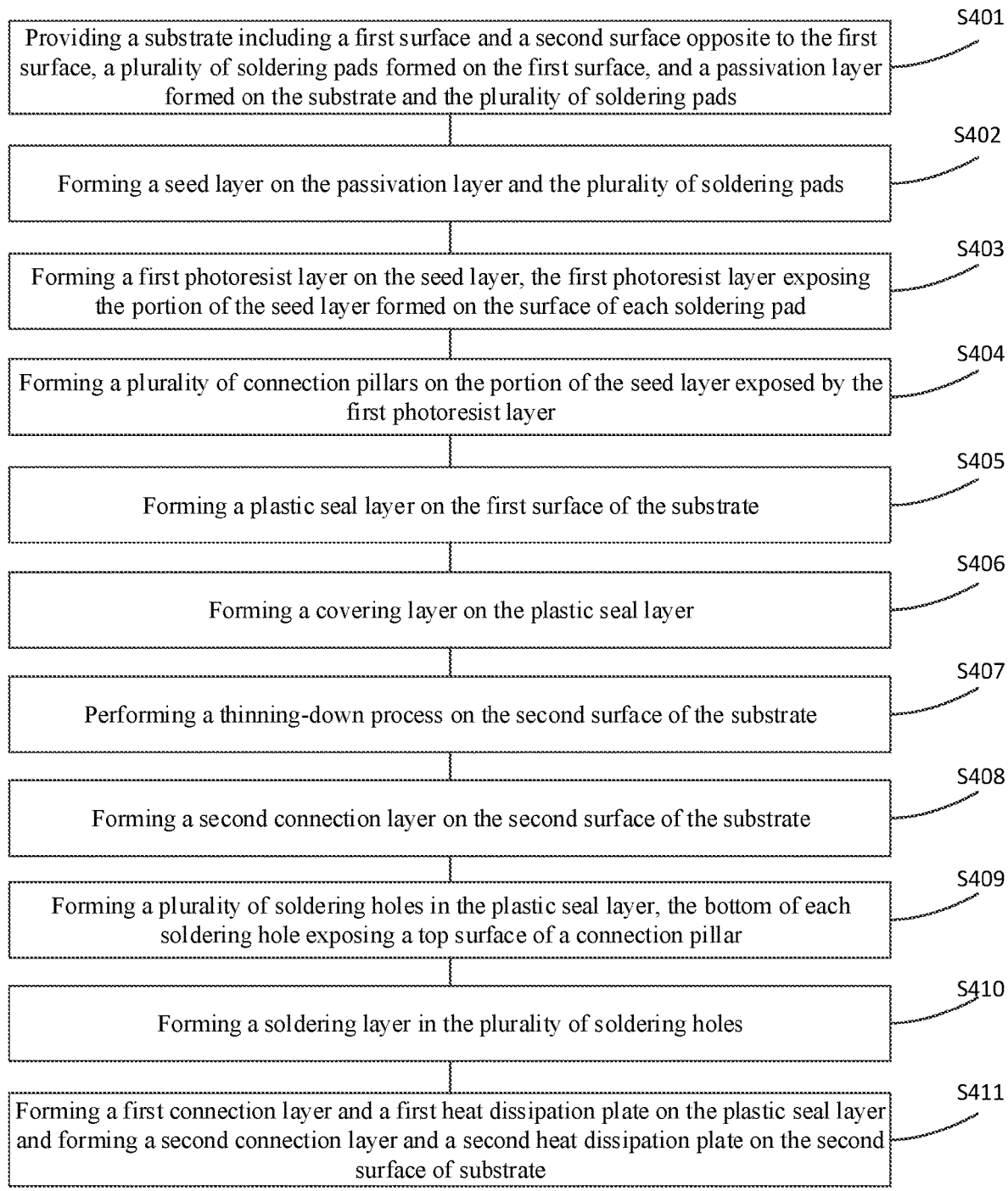
FIG. 15 illustrates a flowchart of the exemplary method for fabricating a semiconductor structure consistent with various embodiments of the present disclosure.

The present disclosure provides a method for fabricating semiconductor structures. FIG. 15 illustrates a flowchart of an exemplary method for fabricating a semiconductor structure consistent with various embodiments of the present disclosure. FIGS. 5-14 illustrate schematic views of semiconductor structures at certain stages of the exemplary fabrication method.

Figure 5:
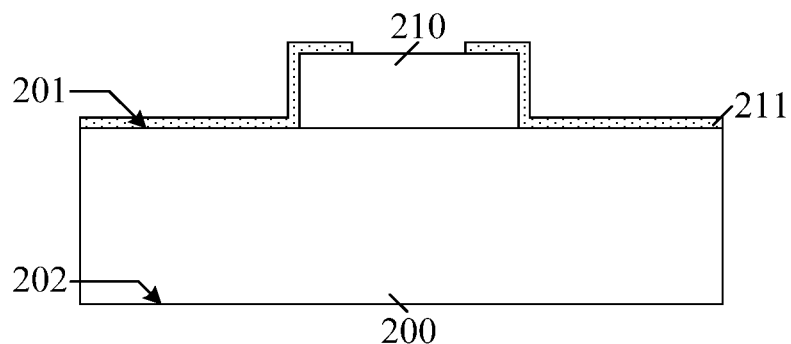
FIGS. 5-14 illustrate schematic views of structures at certain stages of an exemplary fabrication method for a semiconductor structure consistent with various embodiments of the present disclosure.

Referring to FIG. 15, at the beginning of the fabrication process, a substrate including a first surface and a second surface may be provided, a plurality of soldering pads may be formed on the first surface of the substrate, and a passivation layer may be formed on the substrate and the plurality of soldering pads (S401). FIG. 5 illustrates a schematic cross-section view of a semiconductor structure consistent with some embodiments of the present disclosure.

Referring to FIG. 5, a substrate 200 may be provided. The substrate 200 may include a first surface 201, and a second surface 202 opposite to the first surface 201. In one embodiment, the substrate 200 may be a chip or a wafer.

The first surface 201 may be a functional surface. A plurality of semiconductor devices may be formed on the functional surface. That is, a plurality of semiconductor devices may be formed on the first surface 201 of the substrate 200. In one embodiment, the semiconductor devices formed on the first surface 201 of the substrate 200 may include a plurality of insulated-gate bipolar transistors (IGBTs). In other embodiments, the semiconductor devices formed on the first surface 201 of the substrate 200 may also include other types of semiconductor devices such as metal-oxide-semiconductor (MOS) transistors, diodes, triodes, resistors, etc.

In one embodiment, each IGBT may include a drift region in the substrate 200, a gate structure formed in the drift region, a well region in the drift region on each side of the gate structure, and an emitter region formed in the well region.

In one embodiment, a plurality of soldering pads 210 may be formed on the substrate 200. In other embodiments, the semiconductor structure may not have any soldering pad formed on the substrate.

In one embodiment, the number of the soldering pads 210 formed on the substrate 200 may be more than one. However, as shown in FIG. 5, only one soldering pad 210 is provided as an example to illustrate the disclosed fabrication method. The soldering pad 210 may be electrically connected to the emitter region and the gate structure of the exemplary IGBT device. The soldering pad 210 may be made of Cu and/or Al.

In one embodiment, a passivation layer 211 may be formed on the substrate 200 and the plurality of soldering pads 210. The passivation layer 211 may expose a portion of the top surface of the soldering pad 210. The passivation layer 211 may be used to protect the substrate 200 so that influence of the external environment on the substrate 200 may be reduced or avoided. In one embodiment, the passivation layer 211 may be made of $SiN_x$, polyamide, or any other suitable material(s).

Figure 6:
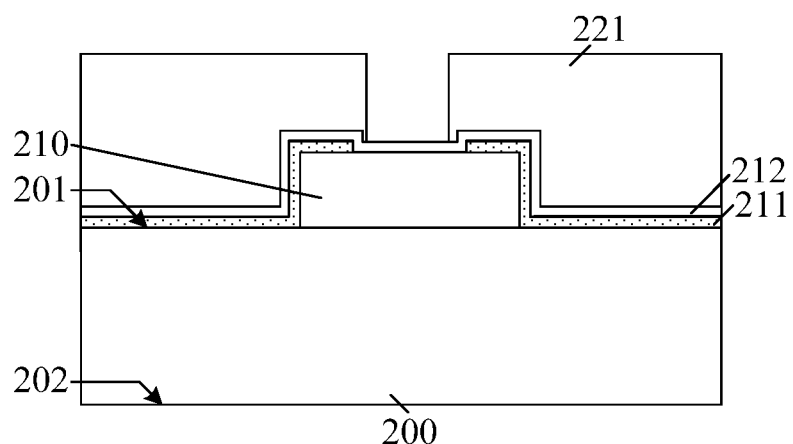

Further, returning to FIG. 15, a seed layer may be formed on the passivation layer and the plurality of soldering pads (S402). FIG. 6 illustrates a schematic cross-section view of a semiconductor structure consistent with some embodiments of the present disclosure.

Referring to FIG. 6, a seed layer 212 may be formed on the passivation layer 211 and the surface of each soldering pad 210. The seed layer 212 may be used to provide seed crystals for further forming a plurality of connection pillars in a subsequent process.

In one embodiment, the seed layer may be made of Cu. The process to form the seed layer 212 may be a physical vapor deposition (PVD) process.

When the thickness of the seed layer 212 is too small, the seed layer 212 may not be able to provide a complete crystal structure for the subsequently-formed connection pillars. When the thickness of the seed layer 212 is too large, the fabrication process may become more difficult. Therefore, in one embodiment, the thickness of the seed layer 212 may be in a range of approximately 1000 Å to 6000 Å.

In one embodiment, prior to forming the seed layer 212, the fabrication method may also include forming a barrier layer (not shown) on the passivation layer 211 and the plurality of soldering pads 210. The barrier layer may be used to isolate the passivation layer 211 from the seed layer 212, preventing the atoms of the material used to form the seed layer 212 from diffusing into the passivation layer 211. The barrier layer may be made of one or more of $TiN_x$, $TaN_x$, Ti, and Ta.

When the thickness of the barrier layer is too small, the barrier layer may not be able to effectively prevent the atoms of the material of the seed layer 212 from diffusing into the passivation layer 211. When the thickness of the barrier layer is too large, the fabrication process may be more difficult. Therefore, in one embodiment, the thickness of the barrier layer may be in a range of approximately 100 Å to 500 Å.

Further, returning to FIG. 15, a first photoresist layer may be formed on the seed layer, the first photoresist layer exposing the portion of the seed layer formed on the surface of each soldering pad (S403).

Referring to FIG. 6, a first photoresist layer 221 may be formed on the seed layer 212. The first photoresist layer 221 may expose the portion of the seed layer 212 formed on the surface of each soldering pad 210.

The first photoresist layer 221 may be used to define the dimensions and the positions of a plurality of connection pillars formed in a subsequent process. In one embodiment, the first photoresist layer 221 may be formed by a spin-coating process.

Figure 7:
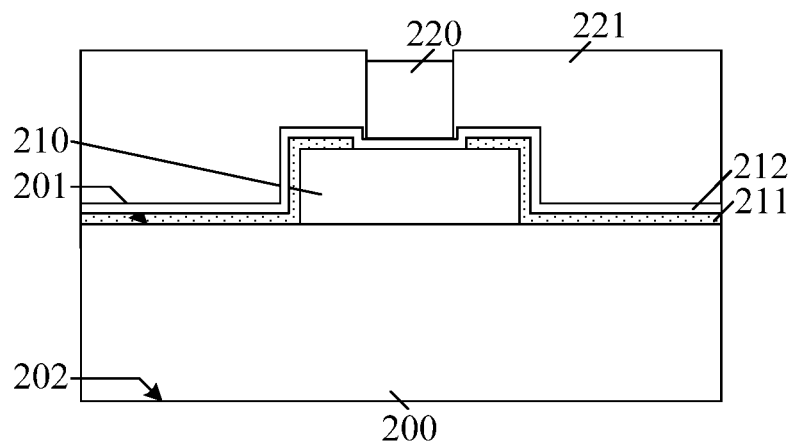

Further, returning to FIG. 15, a plurality of connection pillars may be formed on the portion of the seed layer exposed by the first photoresist layer (S404). FIG. 7 illustrates a schematic cross-section view of a semiconductor structure consistent with some embodiments of the present disclosure.

Referring to FIG. 7, a plurality of connection pillars 220 may be formed on the portion of the seed layer 212 exposed by the first photoresist layer 221. Each connection pillar 220 may be used to electrically connect a corresponding soldering pad 210 to a first connection layer (e.g., a first connection layer 241 in FIG. 14).

In one embodiment, the connection pillar 220 may be made of Cu. In other embodiments, the connection pillar may be made of Al or W. Moreover, in one embodiment, the connection pillar 220 may be formed by an electrochemical coating process any other appropriate process.

After forming the connection pillar 220 on the portion of the seed layer 212 exposed by the first photoresist layer 221, the fabrication method may further include removing the first photoresist layer 221.

Figure 8:
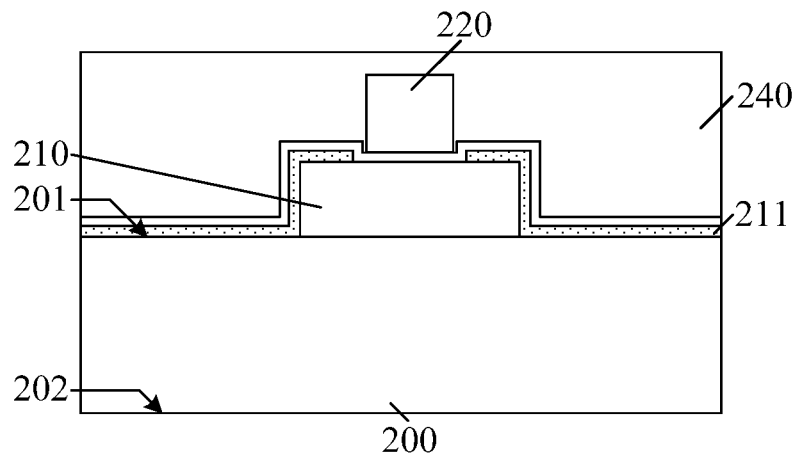

Further, returning to FIG. 15, a plastic seal layer may be formed on the first surface of the substrate (S405). FIG. 8 illustrates a schematic cross-section view of a semiconductor structure consistent with some embodiments of the present disclosure.

Referring to FIG. 8, a plastic seal layer 240 may be formed on the first surface 201 of the substrate 200. The plastic seal layer 240 may be used to support the substrate 200 during the subsequently-performed thinning-down process in order to prevent the substrate 200 from being broken. The plastic seal layer 240 may also be used as a packaging material to isolate the substrate 200 from the external environment such that the influence of the external environment on the substrate 200 may be prevented.

In one embodiment, the plastic seal layer 240 may cover the top and the sidewall surfaces of each connection pillar 220. In other embodiments, the plastic seal layer may expose the top surface of each connection pillar.

In one embodiment, the plastic seal layer 240 may be made of a polymer. Moreover, the process to form the plastic seal layer 240 may include forming a precursor on the first surface 201 of the substrate, and then performing a heat treatment process on the precursor such that the precursor may be solidified to form the plastic seal layer 240.

The precursor may be a fluid, and thus may demonstrate desired ability to cover the plurality of connection pillars 220. As such, desired isolation between the external environment and the substrate 200 may be achieved. Moreover, the plastic layer formed from the precursor after the precursor is solidified may have desired hardness, and thus may be able to support the substrate 200 during the subsequently-performed thinning-down process.

When the thickness of the plastic seal layer 240 is too small, the plastic seal layer 240 may not be able to provide sufficient support and protection for the substrate 200. When the thickness of the plastic seal layer 240 is too large, the fabrication process may become more difficult. Therefore, in one embodiment, the thickness of the plastic seal layer 240 may be in a range of approximately 100 μm to 600 μm.

Figure 9:
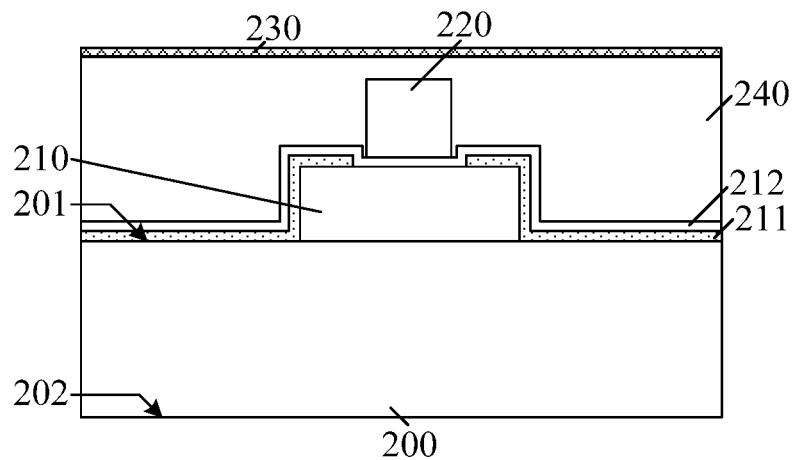

Returning to FIG. 15, a covering layer may be formed on the plastic seal layer (S406). FIG. 9 illustrates a schematic cross-section view of a semiconductor structure consistent with some embodiments of the present disclosure.

Referring to FIG. 9, a covering layer 230 may be formed on the plastic seal layer 240. The covering layer 230 may be used to protect the plastic seal layer 240, and thus may prevent the plastic layer 240 from being scratched, for example.

In one embodiment, the covering layer 230 may be made of glass. Alternatively, the covering layer may be made of silicon. In some other embodiments, the covering layer may not be formed in the semiconductor structure.

Figure 10:
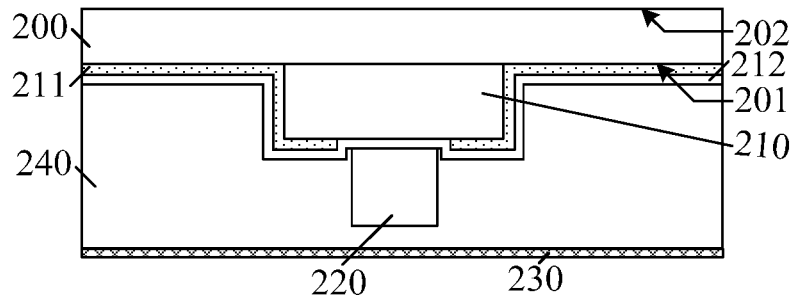

Returning to FIG. 15, after forming the plastic seal layer, a thinning-down process may be performed on the second surface of the substrate (S407). FIG. 10 illustrates a schematic cross-section view of a semiconductor structure consistent with some embodiments of the present disclosure.

Referring to FIG. 10, after forming the plastic seal layer 240, a thinning-down process may be performed on the second surface 202 of the substrate 200, an opposite side to the plastic seal layer 240. In the embodiment when the covering layer 230 is formed on the plastic seal layer 240, the thinning-down process may be performed on the second surface 202 of the substrate 200 after forming the covering layer 230.

In one embodiment, the thinning-down process may be a chemical mechanical polishing (CMP) process. In other embodiments, the thinning-down process may be a wafer backgrinding process, e.g., a TAIKO process. For example, the second surface of the substrate may include a center region and a periphery region surrounding the center region, and according to the TAIKO process, the material removed from the center region of the second surface has a larger amount as compared to the material removed from the periphery region of the second surface. Therefore, after the thinning-down process, the thickness of the substrate at the periphery region may be larger than the thickness of the substrate at the center region and, thus, the portion of the substrate at the periphery region may be able to provide support for the portion of the substrate at the center region.

Moreover, according to the disclosed fabrication method, prior to performing the thinning-down process, a plastic seal layer 240 may be formed on the first surface 201 of the substrate 200. The plastic seal layer 240 may be able to support the substrate 200 during the thinning-down process, and thus warping or cracking of the plastic seal layer 240 may be avoided. In addition, the plastic seal layer 240 may be used as a material for packaging the substrate 200. Therefore, after the thinning-down process, the plastic seal layer 240 may not need to be removed. As such, the fabrication process may be simplified, and the production cost may be reduced.

Figure 11:
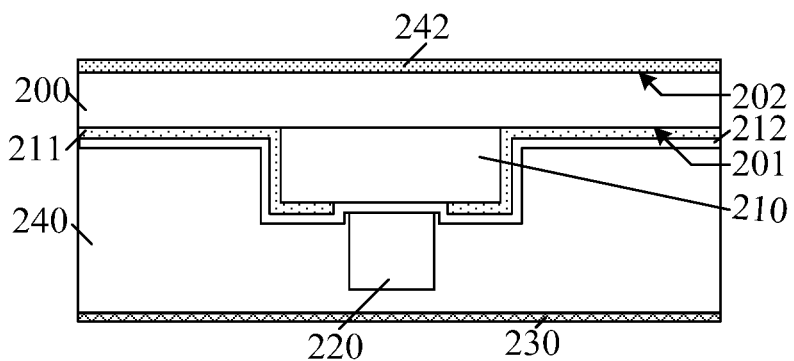

Further, returning to FIG. 15, after the thinning-down process, a second connection layer may be formed on the second surface of the substrate (S408). FIG. 11 illustrates a schematic cross-section view of a semiconductor structure consistent with some embodiments of the present disclosure.

Referring to FIG. 11, after the thinning-down process, a second connection layer 242 may be formed on the second surface 202 of the substrate. The second connection layer 242 may be used to electrically connect the second surface 202 of the substrate 200 to the external circuits.

In one embodiment, the second connection layer 242 may be made of Cu. In other embodiments, the second connection layer may be made of Al. In one embodiment, the second connection layer 242 may be formed by an electrochemical coating process or any other appropriate process.

In one embodiment, a plurality of IGBTs are formed in the substrate 200. Therefore, prior to forming the second connection layer 242, the fabrication method may also include performing an ion implantation process on the second surface of the substrate to form a collector region corresponding to each IGBT. The second connection layer 242 may thus be formed to electrically connect the collector region to the external circuits.

In the embodiment when the covering layer 230 is formed on the plastic seal layer 240, the fabrication method may also include removing the covering layer 230 after performing the thinning-down process and prior to forming the second connection layer 242.

Figure 12:
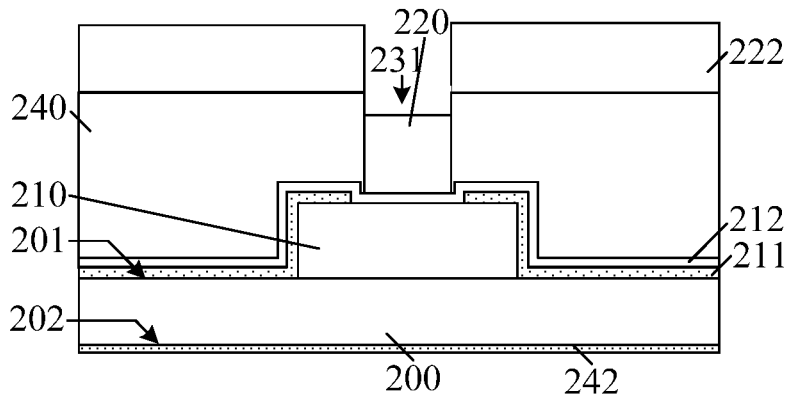

Further, returning to FIG. 15, after performing the thinning-down process, a plurality of soldering holes may be formed in the plastic seal layer, and the bottom of each soldering hole may expose the top surface of a corresponding connection pillar (S409). FIG. 12 illustrates a schematic cross-section view of a semiconductor structure consistent with some embodiments of the present disclosure.

Referring to FIG. 12, after performing the thinning-down process, a plurality of holes may be drilled in the plastic seal layer 240. The plurality of holes formed in the plastic seal layer 240 may be a plurality of soldering holes 231. Moreover, the bottom of each soldering hole 231 may expose the top surface of a corresponding connection pillar 220.

In a subsequent process, the plurality of soldering holes 231 may be used to contain a soldering layer. In one embodiment, the process to drill the plurality of holes in the plastic seal layer 240 may be a laser drilling process. Moreover, during the laser drilling process, the process parameters may include a laser-beam wavelength of 532 nm.

Further, returning to FIG. 15, a soldering layer may be formed in the plurality of soldering holes (S410). FIG. 13 illustrates a schematic cross-section view of a semiconductor structure consistent with some embodiments of the present disclosure.

Referring to FIG. 13, a soldering layer 260 may be formed in the plurality of soldering holes 231. The soldering layer 260 may be used to realize the connection between the each connection pillar 220 and a subsequently-formed first connection layer.

In one embodiment, the soldering layer 260 may be made of Sn. Moreover, the surface of the soldering layer 260 may be higher than the top surface of the plastic seal layer 240. Having the surface of the soldering layer 260 higher than the surface of the plastic seal layer may be conducive to forming desired contacts between the soldering layer 260 and the subsequently-formed first connection layer. In other embodiments, the surface of the soldering layer may be leveled with the surface of the plastic seal layer.

In one embodiment, forming the soldering layer 260 may include the following exemplary steps. A second photoresist layer 222 (referring to FIG. 12) may be formed on the plastic seal layer 240. The second photoresist layer 222 may expose the top surfaces of the plurality of connection pillars 220 exposed on the bottom of the plurality of soldering holes 231 (referring to FIG. 12). Further, the soldering layer 260 may then be formed in the plurality of soldering holes 231.

In one embodiment, after forming the soldering layer 260, the fabrication method may also include removing the second photoresist layer 222.

Further, returning to FIG. 15, a first connection layer and a first heat dissipation plate may be formed on the plastic seal layer and the soldering layer with the first connection layer formed between the first heat dissipation plate and the soldering layer and also between the first heat dissipation plate and the plastic seal layer, and a second heat dissipation plate may be formed on the surface of the second connection layer with the second connection layer formed between the second heat dissipation plate and the second surface of the substrate (S411). FIG. 14 illustrates a schematic cross-section view of a semiconductor structure consistent with some embodiments of the present disclosure.

Referring to FIG. 14, a first connection layer 241 and a first heat dissipation plate 251 may be formed on the plastic seal layer 240 and the soldering layer 260. The first connection layer 241 may be located between the first heat dissipation plate 251 and the soldering layer 260 and also between the first heat dissipation plate 251 and the plastic seal layer 240. In addition, a second heat dissipation plate 252 may be formed on the surface of the second connection layer 242. The second connection layer 242 may be located between the second heat dissipation plate 252 and the second surface 202 of the substrate 200.

In one embodiment, the second connection layer 242 may be made of Cu. In other embodiments, the second connection layer may be made of Al.

In one embodiment, the first heat dissipation plate 21 and the second heat dissipation plate 252 may be made of ceramic.

In one embodiment, with the formed semiconductor structure including the first heat dissipation plate 251 and the second heat dissipation plate 252, the substrate 200 may be cooled down through the first heat dissipation plate 251 and the second heat dissipation plate 252. As such, the formed semiconductor structure may be conducive to improving the heat dissipation efficiency for the substrate 200. Therefore, the performance of the formed semiconductor structure may be improved.

According to the disclosed fabrication method, prior to performing the thinning-down process, a plastic seal layer is formed on the first surface of the substrate. The plastic seal layer is able to support the substrate during the thinning-down process, and thus warping or cracking of the plastic seal layer 240 may be avoided. In addition, the plastic seal layer may be used as a material for packaging the substrate. Therefore, after the thinning-down process, the plastic seal layer may not need to be removed. As such, the fabrication process may be simplified, and the production cost may be reduced.

Further, the formed semiconductor structure includes the first heat dissipation plate and the second heat dissipation plate such that the substrate may be cooled down through the first heat dissipation plate and the second heat dissipation plate. Therefore, the formed semiconductor structure may be conducive to improving the heat dissipation efficiency for the substrate, and thus the performance of the formed semiconductor structure may be improved.

The present disclosure also provides a semiconductor structure. FIG. 14 illustrates a schematic cross-section view of an exemplary semiconductor structure consistent with some embodiments of the present disclosure.

Referring to FIG. 14, the semiconductor structure may include a substrate 200. The substrate 200 may include a first surface 201 and, opposite to the first surface 201, a second surface 202. The first surface 201 may be a functional surface. That is, a plurality of semiconductor devices may be formed on the first surface 201. The semiconductor structure may also include a plurality of soldering pads 210 formed on the substrate 200, and a passivation layer 211 formed on the substrate 200 and the plurality of soldering pads 210. The passivation layer may expose a portion of the top surface of each soldering pad 210. Moreover, although the semiconductor structure may include a plurality of soldering pads 210, only one soldering pad 210 is provided in FIG. 14 as an example to illustrate the disclosed semiconductor structure.

The semiconductor structure may include a seed layer 212 formed on the passivation layer 211 and the surface of each soldering pad 210, and a plurality of connection pillars 220. Each connection pillar 220 may be formed on the portion of the seed layer 212 on a corresponding soldering pad 210. The semiconductor structure may also include a plastic seal layer 240 formed on the seed layer 212 and covering the side surfaces of each connection pillar 220, and a soldering layer 260 formed on the top surface of the each connection pillar 220. The top surface of the soldering layer 260 may be leveled with the top surface of the plastic seal layer 240.

The semiconductor structure may further include a first connection layer 241 formed on the plastic seal layer 240 and the soldering layer 260, and a first heat dissipation plate 251 formed on the first connection layer 241. Moreover, the semiconductor structure may also include a second connection layer 242 formed on the second surface 202 of the substrate 200, and a second heat dissipation plate 252 formed on the second connection layer 242.

The thickness of the substrate 200 of the semiconductor structure may be reduced during the fabrication process. The detailed method for fabricating the semiconductor structure may be referred to the corresponding description in the above embodiments.

Compared to conventional semiconductor structures and fabrication methods, the disclosed semiconductor structures and fabrication methods may demonstrate advantages.

According to the disclosed semiconductor structures and fabrication methods, prior to performing the thinning-down process, a plastic seal layer is formed on the first surface of the substrate. The plastic seal layer is able to support the substrate during the thinning-down process, and thus warping or cracking of the plastic seal layer 240 may be avoided. In addition, the plastic seal layer may be used as a material for packaging the substrate. Therefore, after the thinning-down process, the plastic seal layer may not need to be removed. As such, the fabrication process may be simplified, and the production cost may be reduced.

Further, the formed semiconductor structure includes the first heat dissipation plate and the second heat dissipation plate such that the substrate may be cooled down through the first heat dissipation plate and the second heat dissipation plate. Therefore, the formed semiconductor structure may be conducive to improving the heat dissipation efficiency for the substrate, and thus the performance of the formed semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    providing a substrate including a first surface and a second surface opposite to the first surface, wherein the first surface is a functional surface;
    forming a plurality of soldering pads on the substrate;
    forming a passivation layer on the first surface, side surfaces of the plurality of soldering pads, and top surfaces of the plurality of soldering pads, the passivation layer completely covers the first surface exposed by the plurality of soldering pads and the side surfaces of the plurality of soldering pads, and partially covers the top surfaces of the plurality of soldering pads;
    forming a plastic seal layer on the first surface of the substrate, the plastic sea layer is isolated from the substrate by the passivation layer; and
    performing a thinning-down process on the second surface of the substrate after forming the plastic seal layer.

2. The method according to claim 1, wherein:
    the plastic seal layer is made of a polymer.

3. The method according to claim 2, wherein forming the plastic seal layer includes:
    forming a precursor on the first surface of the substrate; and
    performing a heat treatment process on the precursor to solidify the precursor and form the plastic seal layer.

4. The method according to claim 1, wherein:
    a thickness of the plastic seal layer is in a range of approximately 100 μm to 600 μm.

5. The method according to claim 1, wherein:
    the thinning-down process is a chemical mechanical polishing (CMP) process or a backgrinding process.

6. The method according to claim 1, wherein:
    prior to the thinning-down process, a covering layer is formed on the plastic seal layer; and
    after the thinning-down process, the covering layer is removed.

7. The method according to claim 6, wherein:
    the covering layer is made of glass.

8. The method according to claim 1, after performing the thinning-down process, further including:
    forming a first connection layer on the plastic seal layer, and forming a first heat dissipation plate on the first connection layer; and
    forming a second connection layer and a second heat dissipation plate on the second surface of the substrate, wherein the second connection layer is between the second surface of the substrate and the second heat dissipation plate.

9. The method according to claim 8, wherein:
    the first heat dissipation plate and the second heat dissipation plate are made of ceramic.

10. The method according to claim 1, wherein:
    prior to forming the plastic seal layer, a connection pillar is formed on each soldering pad.

11. The method according to claim 10, wherein:
    the connection pillar is made of one or more of Cu and Al.

12. The method according to claim 10, wherein forming the connection pillar on each soldering pad includes:
    forming a seed layer on the first surface of the substrate and a surface of the soldering pad;
    forming a first photoresist layer on the seed layer, the first photoresist layer exposing a portion of the seed layer formed on the surface of the soldering pad; and
    forming the connection pillar on the portion of the seed layer exposed by the first photoresist layer.

13. A method for fabricating a semiconductor structure, comprising:
    providing a substrate including a first surface and a second surface opposite to the first surface, wherein the first surface is a functional surface;
    forming a plastic seal layer on the first surface of the substrate; and
    performing a thinning-down process on the second surface of the substrate after forming the plastic seal layer, wherein:
        a plurality of soldering pads are formed on the substrate;
        prior to forming the plastic seal layer, a connection pillar is formed on each soldering pad; and
        the plastic seal layer covers top and sidewall surfaces of the connection pillars, and after performing the thinning-down process:
            a plurality of soldering holes are formed in the plastic seal layer with each soldering hole exposing a top surface of a connection pillar; and
            a soldering layer is formed in each soldering hole.

14. The method according to claim 13, wherein:
    the connection pillar is made of Cu; and
    the soldering layer is made of Sn.

15. The method according to claim 13, wherein:
    the plurality of soldering holes are formed by a laser drilling process; and
    a laser-beam wavelength used in the laser drilling process is 532 nm.

16. The method according to claim 13, wherein:
    a top surface of the soldering layer is higher than a top surface of the plastic seal layer.

17. The method according to claim 16, wherein forming the soldering layer includes:

forming a second photoresist layer on the plastic seal layer, the second photoresist layer exposing a top surface of each connection pillar on a bottom of a soldering hole; and forming the soldering layer in the soldering hole.

* * * * *